United States Patent
Zheng et al.

(10) Patent No.: US 7,422,635 B2
(45) Date of Patent: Sep. 9, 2008

(54) METHODS AND APPARATUS FOR PROCESSING MICROFEATURE WORKPIECES, E.G., FOR DEPOSITING MATERIALS ON MICROFEATURE WORKPIECES

(75) Inventors: Lingyi A. Zheng, Boise, ID (US); Trung T. Doan, Pflugerville, TX (US); Lyle D. Breiner, Meridian, ID (US); Er-Xuan Ping, Meridian, ID (US); Kevin L. Beaman, Boise, ID (US); Ronald A. Weimer, Boise, ID (US); David J. Kubista, Nampa, ID (US); Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 229 days.

(21) Appl. No.: 10/652,461

(22) Filed: Aug. 28, 2003

(65) Prior Publication Data

US 2005/0045102 A1    Mar. 3, 2005

(51) Int. Cl.
*C23C 16/00* (2006.01)
*C23C 16/455* (2006.01)
*H01L 21/306* (2006.01)

(52) U.S. Cl. .................. 118/715; 118/724; 156/345.33
(58) Field of Classification Search ................. 118/724, 118/725, 715; 156/345.33
See application file for complete search history.

(56) References Cited

U.S. PATENT DOCUMENTS

| | | | |
|---|---|---|---|
| 579,269 A | 3/1897 | Hent | |
| 2,508,500 A | 5/1950 | de Lange | |
| 3,522,836 A | 8/1970 | King | |
| 3,618,919 A | 11/1971 | Beck | |
| 3,620,934 A | 11/1971 | Endle | |

(Continued)

FOREIGN PATENT DOCUMENTS

| | | | |
|---|---|---|---|
| DE | 198 51 824 A1 | | 5/2000 |
| EP | 1 167 569 A1 | | 1/2002 |
| JP | 60-054443 | * | 3/1985 |
| JP | 62-235728 | * | 10/1987 |
| JP | 62-263629 | * | 11/1987 |

(Continued)

OTHER PUBLICATIONS

Integrated Process Systems Ltd., "ALD & CVD", 2 pages, retrieved from the Internet on Dec. 11, 2001, <http://www.ips-tech.com/eng/pro-p2-2.htm>.

(Continued)

*Primary Examiner*—Jeffrie R Lund
(74) *Attorney, Agent, or Firm*—Perkins Coie LLP

(57) ABSTRACT

The present disclosure suggests several systems and methods for batch processing of microfeature workpieces, e.g., semiconductor wafers or the like. One exemplary implementation provides a method of depositing a reaction product on each of a batch of workpieces positioned in a process chamber in a spaced-apart relationship. A first gas may be delivered to an elongate first delivery conduit that includes a plurality of outlets spaced along a length of the conduit. A first gas flow may be directed by the outlets to flow into at least one of the process spaces between adjacent workpieces along a first vector that is transverse to the direction in which the workpieces are spaced. A second gas may be delivered to an elongate second delivery conduit that also has outlets spaced along its length. A second gas flow of the second gas may be directed by the outlets to flow into the process spaces along a second vector that is transverse to the first direction.

17 Claims, 7 Drawing Sheets

U.S. PATENT DOCUMENTS

| | | | |
|---|---|---|---|
| 3,630,769 A | 12/1971 | Hart et al. | |
| 3,630,881 A | 12/1971 | Lester et al. | |
| 3,634,212 A | 1/1972 | Valayll et al. | |
| 4,018,949 A | 4/1977 | Donakowski et al. | |
| 4,098,923 A * | 7/1978 | Alberti et al. | 438/784 |
| 4,242,182 A | 12/1980 | Popescu | |
| 4,269,625 A | 5/1981 | Molenaar | |
| 4,289,061 A | 9/1981 | Emmett | |
| 4,313,783 A | 2/1982 | Davies et al. | |
| 4,388,342 A | 6/1983 | Suzuki et al. | |
| 4,397,753 A | 8/1983 | Czaja | |
| 4,436,674 A | 3/1984 | McMenamin | |
| 4,438,724 A | 3/1984 | Doehler et al. | |
| 4,469,801 A | 9/1984 | Hirai et al. | |
| 4,509,456 A | 4/1985 | Kleinert et al. | |
| 4,545,136 A | 10/1985 | Izu et al. | |
| 4,590,042 A | 5/1986 | Drage | |
| 4,593,644 A | 6/1986 | Hanak | |
| 4,681,777 A | 7/1987 | Engelken et al. | |
| 4,826,579 A | 5/1989 | Westfall | |
| 4,871,417 A | 10/1989 | Nishizawa et al. | |
| 4,894,132 A | 1/1990 | Tanaka | |
| 4,911,638 A | 3/1990 | Bayne et al. | |
| 4,923,715 A | 5/1990 | Matsuda et al. | |
| 4,948,979 A | 8/1990 | Munakata et al. | |
| 4,949,669 A | 8/1990 | Ishii et al. | |
| 4,966,646 A | 10/1990 | Zdeblick | |
| 4,977,106 A | 12/1990 | Smith | |
| 5,015,330 A * | 5/1991 | Okumura et al. | 438/694 |
| 5,017,404 A | 5/1991 | Paquet et al. | |
| 5,020,476 A | 6/1991 | Bay et al. | |
| 5,062,446 A | 11/1991 | Anderson | |
| 5,076,205 A | 12/1991 | Vowles et al. | |
| 5,090,985 A | 2/1992 | Soubeyrand | |
| 5,091,207 A | 2/1992 | Tanaka | |
| 5,131,752 A | 7/1992 | Yu et al. | |
| 5,136,975 A | 8/1992 | Bartholomew et al. | |
| 5,172,849 A | 12/1992 | Barten et al. | |
| 5,200,023 A | 4/1993 | Gifford et al. | |
| 5,223,113 A | 6/1993 | Kaneko et al. | |
| 5,232,749 A | 8/1993 | Gilton | |
| 5,248,527 A | 9/1993 | Uchida et al. | |
| 5,286,296 A | 2/1994 | Sato et al. | |
| 5,325,020 A | 6/1994 | Campbell et al. | |
| 5,364,219 A | 11/1994 | Takahashi et al. | |
| 5,366,557 A | 11/1994 | Yu | |
| 5,377,429 A | 1/1995 | Sandhu et al. | |
| 5,380,396 A | 1/1995 | Shikida et al. | |
| 5,409,129 A | 4/1995 | Tsukada et al. | |
| 5,418,180 A | 5/1995 | Brown | |
| 5,427,666 A | 6/1995 | Mueller et al. | |
| 5,433,787 A | 7/1995 | Suzuki et al. | |
| 5,433,835 A | 7/1995 | Demaray et al. | |
| 5,445,491 A | 8/1995 | Nakagawa et al. | |
| 5,453,124 A | 9/1995 | Moslehi et al. | |
| 5,480,818 A | 1/1996 | Matsumoto et al. | |
| 5,496,410 A | 3/1996 | Fukuda et al. | |
| 5,498,292 A | 3/1996 | Ozaki | |
| 5,500,256 A | 3/1996 | Watabe | |
| 5,522,934 A | 6/1996 | Suzuki et al. | |
| 5,536,317 A | 7/1996 | Crain et al. | |
| 5,562,800 A | 10/1996 | Kawamura et al. | |
| 5,575,883 A | 11/1996 | Nishikawa et al. | |
| 5,589,002 A | 12/1996 | Su | |
| 5,589,110 A | 12/1996 | Motoda et al. | |
| 5,592,581 A | 1/1997 | Okase | |
| 5,595,606 A | 1/1997 | Fujikawa et al. | |
| 5,599,513 A | 2/1997 | Masaki et al. | |
| 5,624,498 A | 4/1997 | Lee et al. | |
| 5,626,936 A | 5/1997 | Alderman | |
| 5,640,751 A | 6/1997 | Faria | |
| 5,643,394 A | 7/1997 | Maydan et al. | |
| 5,654,589 A | 8/1997 | Huang et al. | |
| 5,693,288 A | 12/1997 | Nakamura | |
| 5,716,796 A | 2/1998 | Bull et al. | |
| 5,729,896 A | 3/1998 | Dalal et al. | |
| 5,733,375 A | 3/1998 | Fukuda et al. | |
| 5,746,434 A | 5/1998 | Boyd et al. | |
| 5,754,297 A | 5/1998 | Nulman | |
| 5,766,364 A | 6/1998 | Ishida et al. | |
| 5,769,950 A | 6/1998 | Takasu et al. | |
| 5,769,952 A | 6/1998 | Komino | |
| 5,772,771 A * | 6/1998 | Li et al. | 118/723 I |
| 5,788,778 A | 8/1998 | Shang et al. | |
| 5,792,269 A | 8/1998 | Deacon et al. | |
| 5,792,700 A | 8/1998 | Turner et al. | |
| 5,803,938 A | 9/1998 | Yamaguchi et al. | |
| 5,819,683 A | 10/1998 | Ikeda et al. | |
| 5,820,641 A | 10/1998 | Gu et al. | |
| 5,827,370 A | 10/1998 | Gu | |
| 5,833,888 A | 11/1998 | Arya et al. | |
| 5,846,275 A | 12/1998 | Lane et al. | |
| 5,846,330 A | 12/1998 | Quirk et al. | |
| 5,851,294 A | 12/1998 | Young et al. | |
| 5,851,849 A | 12/1998 | Comizzoli et al. | |
| 5,865,417 A | 2/1999 | Harris et al. | |
| 5,866,986 A | 2/1999 | Pennington | |
| 5,868,159 A | 2/1999 | Loan et al. | |
| 5,879,459 A * | 3/1999 | Gadgil et al. | 118/715 |
| 5,885,425 A | 3/1999 | Hsieh et al. | |
| 5,895,530 A | 4/1999 | Shrotriya et al. | |
| 5,902,403 A | 5/1999 | Aitani et al. | |
| 5,908,947 A | 6/1999 | Vaartstra | |
| 5,911,238 A | 6/1999 | Bump et al. | |
| 5,932,286 A | 8/1999 | Beinglass et al. | |
| 5,940,684 A | 8/1999 | Shakuda et al. | |
| 5,953,634 A | 9/1999 | Kajita et al. | |
| 5,956,613 A | 9/1999 | Zhao et al. | |
| 5,958,140 A | 9/1999 | Arami et al. | |
| 5,961,775 A | 10/1999 | Fujimura et al. | |
| 5,968,587 A | 10/1999 | Frankel | |
| 5,972,430 A | 10/1999 | DiMeo, Jr. et al. | |
| 5,994,181 A | 11/1999 | Hsieh et al. | |
| 5,997,588 A | 12/1999 | Goodwin et al. | |
| 5,998,932 A | 12/1999 | Lenz | |
| 6,006,694 A | 12/1999 | DeOrnellas et al. | |
| 6,008,086 A | 12/1999 | Schuegraf et al. | |
| 6,016,611 A | 1/2000 | White et al. | |
| 6,022,483 A | 2/2000 | Aral | |
| 6,032,923 A | 3/2000 | Biegelsen et al. | |
| 6,039,557 A | 3/2000 | Unger et al. | |
| 6,042,652 A | 3/2000 | Hyun et al. | |
| 6,045,620 A | 4/2000 | Tepman et al. | |
| 6,059,885 A | 5/2000 | Ohashi et al. | |
| 6,062,256 A | 5/2000 | Miller et al. | |
| 6,070,551 A | 6/2000 | Li et al. | |
| 6,079,426 A | 6/2000 | Subrahmanyam et al. | |
| 6,080,446 A | 6/2000 | Tobe et al. | |
| 6,086,677 A | 7/2000 | Umotoy et al. | |
| 6,089,543 A | 7/2000 | Freerks | |
| 6,090,210 A | 7/2000 | Ballance et al. | |
| 6,109,206 A | 8/2000 | Maydan et al. | |
| 6,113,698 A | 9/2000 | Raaijmakers et al. | |
| 6,123,107 A | 9/2000 | Selser et al. | |
| 6,129,331 A | 10/2000 | Henning et al. | |
| 6,139,700 A | 10/2000 | Kang et al. | |
| 6,143,077 A | 11/2000 | Ikeda et al. | |
| 6,143,078 A * | 11/2000 | Ishikawa et al. | 118/715 |
| 6,143,659 A * | 11/2000 | Leem | 438/688 |
| 6,144,060 A | 11/2000 | Park et al. | |
| 6,149,123 A | 11/2000 | Harris et al. | |
| 6,159,297 A | 12/2000 | Herchen et al. | |
| 6,159,298 A | 12/2000 | Saito et al. | |
| 6,160,243 A | 12/2000 | Cozad | |

| | | |
|---|---|---|
| 6,161,500 A | 12/2000 | Kopacz et al. |
| 6,173,673 B1 | 1/2001 | Golovato et al. |
| 6,174,366 B1 | 1/2001 | Ihantola |
| 6,174,377 B1 | 1/2001 | Doering et al. |
| 6,174,809 B1 | 1/2001 | Kang et al. |
| 6,178,660 B1 | 1/2001 | Emmi et al. |
| 6,182,603 B1 | 2/2001 | Shang et al. |
| 6,183,563 B1 | 2/2001 | Choi et al. |
| 6,190,459 B1 | 2/2001 | Takeshita et al. |
| 6,192,827 B1 | 2/2001 | Welch et al. |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,200,415 B1 | 3/2001 | Maraschin |
| 6,203,613 B1 | 3/2001 | Gates et al. |
| 6,206,967 B1 | 3/2001 | Mak et al. |
| 6,206,972 B1 | 3/2001 | Dunham |
| 6,207,937 B1 | 3/2001 | Stoddard et al. |
| 6,210,754 B1 | 4/2001 | Lu et al. |
| 6,211,033 B1 | 4/2001 | Sandhu et al. |
| 6,211,078 B1 | 4/2001 | Mathews |
| 6,214,714 B1 | 4/2001 | Wang et al. |
| 6,237,394 B1 | 5/2001 | Harris et al. |
| 6,237,529 B1 | 5/2001 | Spahn |
| 6,245,192 B1 | 6/2001 | Dhindsa et al. |
| 6,251,190 B1 | 6/2001 | Mak et al. |
| 6,255,222 B1 | 7/2001 | Xia et al. |
| 6,263,829 B1 | 7/2001 | Schneider et al. |
| 6,264,788 B1 | 7/2001 | Tomoyasu et al. |
| 6,270,572 B1 | 8/2001 | Kim et al. |
| 6,273,954 B2 | 8/2001 | Nishikawa et al. |
| 6,277,757 B1 | 8/2001 | Lin et al. |
| 6,277,763 B1 | 8/2001 | Kugimiya et al. |
| 6,280,584 B1 | 8/2001 | Kumar et al. |
| 6,287,965 B1 | 9/2001 | Kang et al. |
| 6,287,980 B1 | 9/2001 | Hanazaki et al. |
| 6,290,491 B1 | 9/2001 | Shahvandi et al. |
| 6,291,337 B1 | 9/2001 | Sidhwa |
| 6,294,394 B1 | 9/2001 | Erickson et al. |
| 6,297,539 B1 | 10/2001 | Ma et al. |
| 6,302,964 B1 | 10/2001 | Umotoy et al. |
| 6,302,965 B1 | 10/2001 | Umotoy et al. |
| 6,303,953 B1 | 10/2001 | Doan et al. |
| 6,305,314 B1 | 10/2001 | Sneh et al. |
| 6,309,161 B1 | 10/2001 | Hofmeister |
| 6,315,859 B1 | 11/2001 | Donohoe |
| 6,328,803 B2 | 12/2001 | Rolfson et al. |
| 6,329,297 B1 | 12/2001 | Balish et al. |
| 6,333,272 B1 | 12/2001 | McMillin et al. |
| 6,334,928 B1 | 1/2002 | Sekine et al. |
| 6,342,277 B1 | 1/2002 | Sherman |
| 6,346,477 B1 | 2/2002 | Kaloyeros et al. |
| 6,347,602 B2 | 2/2002 | Goto et al. |
| 6,347,918 B1 | 2/2002 | Blahnik |
| 6,355,561 B1 | 3/2002 | Sandhu et al. |
| 6,358,323 B1 | 3/2002 | Schmitt et al. |
| 6,364,219 B1 | 4/2002 | Zimmerman et al. |
| 6,374,831 B1 | 4/2002 | Chandran et al. |
| 6,383,300 B1 | 5/2002 | Saito et al. |
| 6,387,185 B2 | 5/2002 | Doering et al. |
| 6,387,207 B1 | 5/2002 | Janakiraman et al. |
| 6,402,806 B1 | 6/2002 | Schmitt et al. |
| 6,402,849 B2 | 6/2002 | Kwag et al. |
| 6,415,736 B1 | 7/2002 | Hao et al. |
| 6,419,462 B1 | 7/2002 | Horie et al. |
| 6,420,230 B1 | 7/2002 | Derderian et al. |
| 6,420,742 B1 | 7/2002 | Ahn et al. |
| 6,425,168 B1 | 7/2002 | Takaku et al. |
| 6,428,859 B1 | 8/2002 | Chiang et al. |
| 6,432,256 B1 | 8/2002 | Raoux |
| 6,432,259 B1 | 8/2002 | Noorbakhsh et al. |
| 6,432,831 B2 | 8/2002 | Dhindsa et al. |
| 6,435,865 B1 | 8/2002 | Tseng et al. |
| 6,444,039 B1 | 9/2002 | Nguyen |
| 6,450,117 B1 | 9/2002 | Murugesh et al. |
| 6,451,119 B2 | 9/2002 | Sneh et al. |
| 6,458,416 B1 | 10/2002 | Derderian et al. |
| 6,461,436 B1 | 10/2002 | Campbell et al. |
| 6,461,931 B1 | 10/2002 | Eldridge |
| 6,486,081 B1 * | 11/2002 | Ishikawa et al. ............ 438/788 |
| 6,503,330 B1 | 1/2003 | Sneh et al. |
| 6,506,254 B1 | 1/2003 | Bosch et al. |
| 6,508,268 B1 | 1/2003 | Kouketsu et al. |
| 6,509,280 B2 | 1/2003 | Choi |
| 6,534,007 B1 | 3/2003 | Blonigan et al. |
| 6,534,395 B2 | 3/2003 | Werkhoven et al. |
| 6,540,838 B2 | 4/2003 | Sneh et al. |
| 6,541,353 B1 | 4/2003 | Sandhu et al. |
| 6,551,929 B1 | 4/2003 | Kori et al. |
| 6,562,140 B1 | 5/2003 | Bondestam et al. |
| 6,562,141 B2 | 5/2003 | Clarke |
| 6,573,184 B2 | 6/2003 | Park |
| 6,579,372 B2 | 6/2003 | Park |
| 6,579,374 B2 | 6/2003 | Bondestam et al. |
| 6,580,174 B2 | 6/2003 | McCormick et al. |
| 6,585,823 B1 * | 7/2003 | Van Wijck ................ 117/89 |
| 6,589,868 B2 | 7/2003 | Rossman |
| 6,593,644 B2 | 7/2003 | Chiu et al. |
| 6,596,085 B1 | 7/2003 | Schmitt et al. |
| 6,602,346 B1 | 8/2003 | Gochberg |
| 6,613,656 B2 | 9/2003 | Li |
| 6,622,104 B2 | 9/2003 | Wang et al. |
| 6,630,201 B2 | 10/2003 | Chiang et al. |
| 6,635,965 B1 | 10/2003 | Lee et al. |
| 6,638,672 B2 | 10/2003 | Deguchi |
| 6,638,859 B2 | 10/2003 | Sneh et al. |
| 6,638,879 B2 | 10/2003 | Hsieh et al. |
| 6,641,673 B2 | 11/2003 | Yang |
| 6,656,282 B2 | 12/2003 | Kim et al. |
| 6,663,713 B1 | 12/2003 | Robles et al. |
| 6,666,982 B2 | 12/2003 | Brcka |
| 6,673,196 B1 | 1/2004 | Oyabu |
| 6,689,220 B1 | 2/2004 | Nguyen |
| 6,704,913 B2 | 3/2004 | Rossman |
| 6,705,345 B1 | 3/2004 | Bifano |
| 6,706,334 B1 | 3/2004 | Kobayashi et al. |
| 6,716,284 B2 | 4/2004 | Campbell et al. |
| 6,734,020 B2 | 5/2004 | Yang et al. |
| 6,758,911 B2 | 7/2004 | Campbell et al. |
| 6,770,145 B2 | 8/2004 | Saito et al. |
| 6,773,507 B2 | 8/2004 | Jallepally et al. |
| 6,787,185 B2 | 9/2004 | Derderian et al. |
| 6,787,463 B2 | 9/2004 | Mardian et al. |
| 6,800,139 B2 | 10/2004 | Shinriki et al. |
| 6,807,971 B2 * | 10/2004 | Saito et al. ............ 134/22.11 |
| 6,814,813 B2 | 11/2004 | Dando et al. |
| 6,818,067 B2 | 11/2004 | Doering et al. |
| 6,818,249 B2 | 11/2004 | Derderian |
| 6,821,347 B2 | 11/2004 | Carpenter et al. |
| 6,830,652 B1 | 12/2004 | Ohmi et al. |
| 6,838,114 B2 | 1/2005 | Carpenter et al. |
| 6,845,734 B2 | 1/2005 | Carpenter et al. |
| 6,849,131 B2 | 2/2005 | Chen et al. |
| 6,861,094 B2 | 3/2005 | Derderian et al. |
| 6,861,356 B2 | 3/2005 | Matsuse et al. |
| 6,881,295 B2 | 4/2005 | Nagakura |
| 6,887,521 B2 | 5/2005 | Basceri |
| 6,905,547 B1 | 6/2005 | Londergan et al. |
| 6,905,549 B2 * | 6/2005 | Okuda et al. ................ 118/715 |
| 6,926,775 B2 | 8/2005 | Carpenter et al. |
| 6,955,725 B2 | 10/2005 | Dando |
| 6,966,936 B2 | 11/2005 | Yamasaki et al. |
| 6,991,684 B2 * | 1/2006 | Kannan et al. ............... 118/724 |
| 7,022,184 B2 * | 4/2006 | Van Wijck ................ 117/201 |
| 7,056,806 B2 | 6/2006 | Basceri et al. |
| 7,086,410 B2 | 8/2006 | Chouno et al. |

| | | |
|---|---|---|
| 7,258,892 B2 | 8/2007 | Beaman et al. |
| 7,282,239 B2 | 10/2007 | Sarigiannis et al. |
| 2001/0001952 A1* | 5/2001 | Nishizawa et al. .......... 118/724 |
| 2001/0010309 A1 | 8/2001 | Van Bilsen |
| 2001/0011526 A1 | 8/2001 | Doering et al. |
| 2001/0012697 A1 | 8/2001 | Mikata |
| 2001/0020447 A1* | 9/2001 | Murugesh et al. ......... 118/723 I |
| 2001/0024387 A1 | 9/2001 | Raaijmakers et al. |
| 2001/0029892 A1 | 10/2001 | Cook et al. |
| 2001/0045187 A1 | 11/2001 | Uhlenbrock |
| 2001/0050267 A1 | 12/2001 | Hwang et al. |
| 2001/0054484 A1 | 12/2001 | Komino |
| 2002/0000202 A1 | 1/2002 | Yuda et al. |
| 2002/0007790 A1 | 1/2002 | Park |
| 2002/0020353 A1 | 2/2002 | Redemann et al. |
| 2002/0042205 A1 | 4/2002 | McMillin et al. |
| 2002/0043216 A1 | 4/2002 | Hwang et al. |
| 2002/0052097 A1 | 5/2002 | Park |
| 2002/0073924 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0094689 A1 | 7/2002 | Park |
| 2002/0100418 A1 | 8/2002 | Sandhu et al. |
| 2002/0104481 A1 | 8/2002 | Chiang et al. |
| 2002/0108714 A1 | 8/2002 | Doering et al. |
| 2002/0110991 A1 | 8/2002 | Li |
| 2002/0127745 A1 | 9/2002 | Lu et al. |
| 2002/0129768 A1 | 9/2002 | Carpemter et al. |
| 2002/0132374 A1 | 9/2002 | Basceri et al. |
| 2002/0144655 A1 | 10/2002 | Chiang et al. |
| 2002/0146512 A1 | 10/2002 | Rossman |
| 2002/0162506 A1 | 11/2002 | Sneh et al. |
| 2002/0164420 A1 | 11/2002 | Derderian et al. |
| 2002/0185067 A1 | 12/2002 | Upham |
| 2002/0195056 A1 | 12/2002 | Sandhu et al. |
| 2002/0195145 A1 | 12/2002 | Lowery et al. |
| 2002/0195201 A1 | 12/2002 | Beer |
| 2002/0197402 A1 | 12/2002 | Chiang et al. |
| 2003/0000473 A1 | 1/2003 | Chae et al. |
| 2003/0003697 A1 | 1/2003 | Agarwal et al. |
| 2003/0003730 A1 | 1/2003 | Li |
| 2003/0013320 A1* | 1/2003 | Kim et al. ................... 438/778 |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0027431 A1 | 2/2003 | Sneh et al. |
| 2003/0031794 A1 | 2/2003 | Tada et al. |
| 2003/0037729 A1 | 2/2003 | DeDontney et al. |
| 2003/0049372 A1* | 3/2003 | Cook et al. ............... 427/248.1 |
| 2003/0060030 A1 | 3/2003 | Lee et al. |
| 2003/0066483 A1 | 4/2003 | Lee et al. |
| 2003/0070609 A1 | 4/2003 | Campbell et al. |
| 2003/0070617 A1 | 4/2003 | Kim et al. |
| 2003/0070618 A1 | 4/2003 | Campbell et al. |
| 2003/0075273 A1 | 4/2003 | Kilpela et al. |
| 2003/0079686 A1 | 5/2003 | Chen et al. |
| 2003/0094903 A1 | 5/2003 | Tao et al. |
| 2003/0098372 A1 | 5/2003 | Kim |
| 2003/0098419 A1 | 5/2003 | Ji et al. |
| 2003/0106490 A1 | 6/2003 | Jallepally et al. |
| 2003/0121608 A1 | 7/2003 | Chen et al. |
| 2003/0159780 A1 | 8/2003 | Carpenter et al. |
| 2003/0192645 A1 | 10/2003 | Liu |
| 2003/0194862 A1 | 10/2003 | Mardian et al. |
| 2003/0200926 A1 | 10/2003 | Dando et al. |
| 2003/0203109 A1 | 10/2003 | Dando et al. |
| 2003/0213435 A1* | 11/2003 | Okuda et al. ................ 118/724 |
| 2004/0000270 A1 | 1/2004 | Carpenter et al. |
| 2004/0003777 A1 | 1/2004 | Carpenter et al. |
| 2004/0007188 A1 | 1/2004 | Burkhart et al. |
| 2004/0025786 A1* | 2/2004 | Kontani et al. .............. 118/715 |
| 2004/0035358 A1 | 2/2004 | Basceri et al. |
| 2004/0040502 A1 | 3/2004 | Basceri et al. |
| 2004/0040503 A1 | 3/2004 | Basceri et al. |
| 2004/0083959 A1 | 5/2004 | Carpenter et al. |
| 2004/0083960 A1 | 5/2004 | Dando |
| 2004/0083961 A1 | 5/2004 | Basceri |
| 2004/0089240 A1 | 5/2004 | Dando et al. |
| 2004/0099377 A1 | 5/2004 | Newton et al. |
| 2004/0124131 A1 | 7/2004 | Aitchison et al. |
| 2004/0154538 A1 | 8/2004 | Carpenter et al. |
| 2004/0226507 A1 | 11/2004 | Carpenter et al. |
| 2004/0226516 A1 | 11/2004 | Daniel et al. |
| 2004/0238123 A1 | 12/2004 | Becknell |
| 2005/0016956 A1 | 1/2005 | Liu et al. |
| 2005/0016984 A1 | 1/2005 | Dando |
| 2005/0022739 A1 | 2/2005 | Carpenter et al. |
| 2005/0028734 A1 | 2/2005 | Carpenter et al. |
| 2005/0039680 A1 | 2/2005 | Beaman et al. |
| 2005/0039686 A1 | 2/2005 | Zheng et al. |
| 2005/0045100 A1 | 3/2005 | Derderian |
| 2005/0045102 A1* | 3/2005 | Zheng et al. ................. 118/722 |
| 2005/0048742 A1* | 3/2005 | Dip et al. .................... 438/476 |
| 2005/0061243 A1 | 3/2005 | Sarigiannis et al. |
| 2005/0081786 A1 | 4/2005 | Kubista et al. |
| 2005/0087130 A1 | 4/2005 | Derderian |
| 2005/0087132 A1 | 4/2005 | Dickey et al. |
| 2005/0087302 A1 | 4/2005 | Mardian |
| 2005/0120954 A1 | 6/2005 | Carpenter et al. |
| 2005/0133161 A1 | 6/2005 | Carpenter et al. |
| 2005/0164466 A1 | 7/2005 | Zheng et al. |
| 2005/0217575 A1 | 10/2005 | Gealy et al. |
| 2005/0217582 A1 | 10/2005 | Kim et al. |
| 2005/0249873 A1 | 11/2005 | Sarigiannis et al. |
| 2005/0249887 A1 | 11/2005 | Dando et al. |
| 2005/0268856 A1 | 12/2005 | Miller et al. |
| 2006/0115957 A1 | 6/2006 | Basceri et al. |
| 2006/0134345 A1 | 6/2006 | Rueger et al. |
| 2006/0165873 A1 | 7/2006 | Rueger et al. |
| 2006/0205187 A1* | 9/2006 | Zheng et al. ................. 438/478 |
| 2006/0213440 A1* | 9/2006 | Zheng et al. ................. 118/715 |
| 2006/0237138 A1 | 10/2006 | Qin et al. |

FOREIGN PATENT DOCUMENTS

| | | |
|---|---|---|
| JP | 63-020490 | 1/1988 |
| JP | 63-111177 | 5/1988 |
| JP | 63-256460 A | 10/1988 |
| JP | 64-81311 * | 3/1989 |
| JP | 1-273991 A | 11/1989 |
| JP | 4-100533 A | 4/1992 |
| JP | 4-213818 A | 8/1992 |
| JP | 6-151558 A | 5/1994 |
| JP | 06-201539 | 7/1994 |
| JP | 6-342785 A | 12/1994 |
| JP | 8-34678 A | 2/1996 |
| JP | 9-82650 A | 3/1997 |
| JP | 10-223719 A | 8/1998 |
| JP | 11-172438 A | 6/1999 |
| JP | 2001-82682 A | 3/2001 |
| JP | 2001-261375 A | 9/2001 |
| JP | 2002-164336 A | 6/2002 |
| JP | 2001-254181 A | 9/2002 |
| SU | 598630 | 3/1978 |
| WO | WO-98/37258 A1 | 8/1998 |
| WO | WO-99/06610 A1 | 2/1999 |
| WO | WO-00/40772 A1 | 7/2000 |
| WO | WO-00/63952 A1 | 10/2000 |
| WO | WO-00/65649 A1 | 11/2000 |
| WO | WO-00/79019 A1 | 12/2000 |
| WO | WO-01/32966 | 5/2001 |
| WO | WO-01/46490 A1 | 6/2001 |
| WO | WO-02/45871 A1 | 6/2002 |
| WO | WO-02/48427 A1 | 6/2002 |
| WO | WO-02/073329 A2 | 9/2002 |

| WO | WO-02/073660 | A2 | 9/2002 |
| WO | WO-02/081771 | A2 | 10/2002 |
| WO | WO-02/095807 | A2 | 11/2002 |
| WO | WO-03/008662 | A2 | 1/2003 |
| WO | WO-03/016587 | A1 | 2/2003 |
| WO | WO-03/028069 | A2 | 4/2003 |
| WO | WO-03/033762 | A1 | 4/2003 |
| WO | WO-03/035927 | A2 | 5/2003 |
| WO | WO-03/052807 | A1 | 6/2003 |

OTHER PUBLICATIONS

Deublin Company, "Rotating Unions", 1 page, retrieved from the Internet on Feb. 4, 2002, <http://www.com/products/rotatingunions.htm>.

Cameron, I., "Atomic Layer Deposition Chamber Works at Low Temperatures", 2 pages, Electronic Times, Jul. 19, 2001, <http://www.electronictimes.com/story/OEG20010719S0042>.

Cutting Edge Optronics, 600W QCW Laser Diode Array, Part No. ARR48P600, 2 pages, Oct. 2001, <www.ceolaser.com>.

Henning, A.K., et al., "Microfluidic MEMS for Semiconductor Processing," IEEE Trans. Components, Packaging, and Manufacturing Technology B21, pp. 329-337, 1998.

Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).

Henning, A.K., "Liquid and gas-liquid phase behavior in thermopneumatically acuated microvalves," Proceedings, Micro Fluidic Devices and Systems (SPIE, Bellingham, WA, 1998; A.B. Frazier and C.H. Ahn, eds.), vol. 3515, pp. 53-63.

Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).

Maillefer, D., et al., "A High-Performance Silicon Micropump for Disposable Drug Delivery Systems," pp. 413-417, IEEE, 2001.

Henning, A.K., et al., "A thermopneumatically actuated microvalve for liquid expansion and proportional control", Proceedings, Transducers '97: 1997 International Solid State Sensors and Actuators Conference, pp. 825-828.

University of California, Berkeley, University Extension, "Atomic Layer Deposition," 5 pages, Sep. 24-25, 2001, <http://www.unex.berkeley.edu/eng/br225/1-1.html>.

Engelke, F., et al., "Determination of Phenylthiohydantoin-Amino Acids by Two-Step Laser Sesportion/Multiphoton Ionization," Analytical Chemistry, vol. 59, No. 6, pp. 909-912, Mar. 15, 1987, The American Chemical Society.

Cowin, J.P., et al., "Measurement of Fast Desportion Kinetics of D2 Form Tungsten By Laser Induced Thermal Desorption," Surface Science, vol. 78, pp. 545-564, 1978, North-Holland Publishing Company.

Ready, J.F., "Effects Due to Absorption of Laser Radiation," Journal of Applied Physics, vol. 36, No. 2, pp. 462-468, Feb. 1965, Journal of Applied Physics, American Institute of Physics.

Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.

Tokyo Electron Limited, Plasma Process System, Trias SPA, 1 page, retrieved from the Internet on Oct. 16, 2004, <http://www.tel.com/eng/products/spe/sdtriasspa.htm>.

Olsson, A., "Valve-less Diffuser Micropumps", ISSN 0281-2878, 66 pages, 1998.

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Henning, A.K. et al., "Contamination Reduction Using MEMS-Based, High-Precision Mass Flow Controllers," Proceedings, Semicon West Symposium on Contamination Free Manufacturing for Semiconductor Processing (Semi, Mountain View, CA, 1998), pp. 1-11.

Henning, A.K., "Microfluidic MEMS," Proceedings, IEEE Aerospace Conference, Paper 4.906 (IEEE Press, Piscataway, NJ, 1998), 16 pages.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.

The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.html>.

Deublin Company, "Sealing," 2 pages, retrieved from the Internet on Feb. 4, 2002, <http://www.deublin.com/products/sealing.htm>.

Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcome to IPS Ltd.", 1 page, retrieved from the Internet on Dec. 11, 2001, <http://www.ips-tech.com/eng/main.htm>.

Takahashi, K et al., "Process Integration of 3D Chip Stack with Vertical Interconnection," pp. 601-609, 2004 Electronic Components and Technology Conference, IEEE, Jun. 2004.

Aera Corporation, "Fundamentals of Mass Flow Control," 1 page, retrieved from the Internet on Mar. 6, 2003, <http://www.aeramfc.com/funda.shtml>.

EMCO Flow Systems, "Mach One Mass Flow Controllers", 1 page, retrieved from the Internet on Nov. 7, 2003, <http://emcoflow.com/mach-one.htm>.

EMCO Flow Systems, Mach One Mass Flow Controller Product Brochure, 6 pages, retrieved from the Internet on Nov. 7, 2003, <http://www.emcoflow.com/literature/brochures_product_sheets/mach_one/mach_one_brochure_2_01.pdf>.

SemiZone, "EMCO Flow Systems Granted Patent for the Mach One Mass Flow Controller for the Semiconductor Industry (Jun. 28, 2001)", 2 pages, retrieved from the internet on Nov. 7, 2003, <http://www.semizone.com/news/item?news_item_id=100223>.

MKS Instruments, Data Sheets, Downstream Plasma Source, Type AX7610, 4 pages, Dec. 2002, <http://www.mksinst.com/docs/UR/ASTEXax7610DS.pdf>.

MKS Instruments, ASTeX® Microwave Plasma Sources and Subsystems, 1 page, retrieved from the Internet on Nov. 19, 2004, <http://www.mksinst.com/PRG2.html>.

* cited by examiner

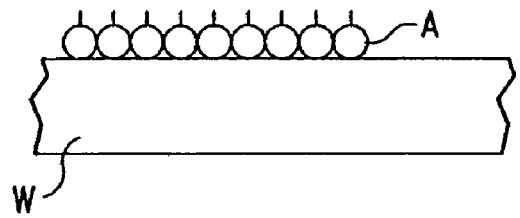
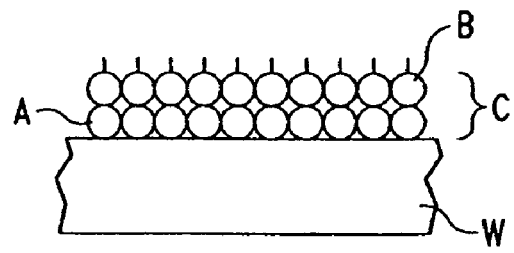
Fig. 1A
*(Prior Art)*
Fig. 1B
*(Prior Art)*
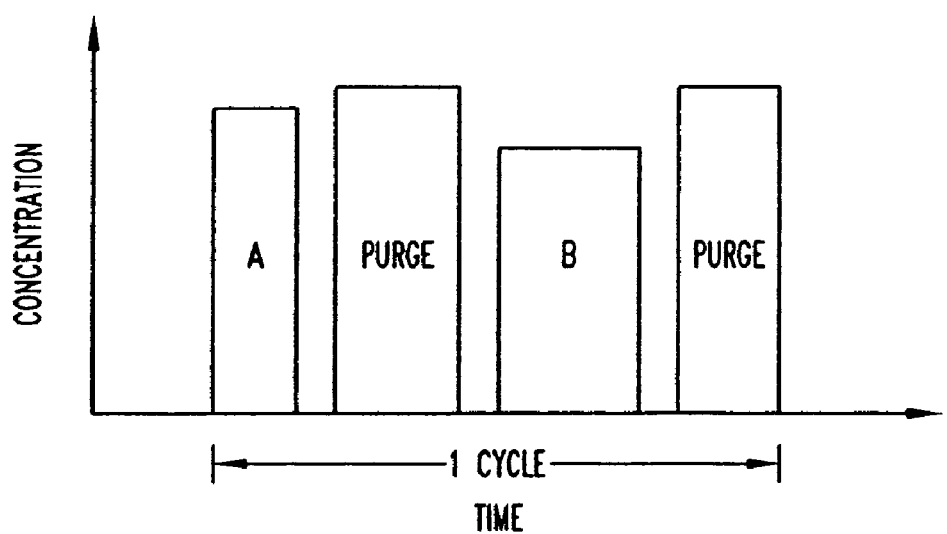
Fig. 2
*(Prior Art)*

METHODS AND APPARATUS FOR PROCESSING MICROFEATURE WORKPIECES, E.G., FOR DEPOSITING MATERIALS ON MICROFEATURE WORKPIECES

TECHNICAL FIELD

The present invention is related to equipment and methods for processing microfeature workpieces, e.g., semiconductor wafers. Aspects of the invention have particular utility in connection with batch deposition of materials on microfeature workpieces, such as by atomic layer deposition or chemical vapor deposition.

BACKGROUND

Thin film deposition techniques are widely used in the manufacturing of microfeatures to form a coating on a workpiece that closely conforms to the surface topography. In the context of microelectronic components, for example, the size of the individual components in the devices on a wafer is constantly decreasing, and the number of layers in the devices is increasing. As a result, the density of components and the aspect ratios of depressions (e.g., the ratio of the depth to the size of the opening) are increasing. The size of such wafers is also increasing to provide more real estate for forming more dies (i.e., chips) on a single wafer. Many fabricators are currently transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is chemical vapor deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within silicon workpieces at higher temperatures. On the other hand, if more reactive precursors are used so that the workpiece temperature can be lower, then reactions may occur prematurely in the gas phase before reaching the intended surface of the workpiece. This is undesirable because the film quality and uniformity may suffer, and also because it limits the types of precursors that can be used.

Atomic layer deposition (ALD) is another thin film deposition technique. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules, and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. The layer of A molecules is then exposed to another precursor gas containing B molecules. The A molecules react with the B molecules to form an extremely thin layer of solid material C on the workpiece W. The chamber is then purged again with a purge gas to remove excess B molecules.

FIG. 2 illustrates the stages of one cycle for forming a thin solid layer using ALD techniques. A typical cycle includes (a) exposing the workpiece to the first precursor A, (b) purging excess A molecules, (c) exposing the workpiece to the second precursor B, and then (d) purging excess B molecules. The purge process typically comprises introducing a purge gas, which is substantially nonreactive with either precursor, and exhausting the purge gas and excess precursor from the reaction chamber in a pumping step. In actual processing, several cycles are repeated to build a thin film on a workpiece having the desired thickness. For example, each cycle may form a layer having a thickness of approximately 0.5-1.0 Å, and thus it takes approximately 60-120 cycles to form a solid layer having a thickness of approximately 60 Å.

One drawback of ALD processing is that it has a relatively low throughput compared to CVD techniques. For example, ALD processing typically takes several seconds to perform each A-purge-B-purge cycle. This results in a total process time of several minutes to form a single thin layer of only 60 Å. In contrast to ALD processing, CVD techniques only require about one minute to form a 60 Å thick layer. In single-wafer processing chambers, ALD processes can be 500%-2000% longer than corresponding single-wafer CVD processes. The low throughput of existing single-wafer ALD techniques limits the utility of the technology in its current state because the ALD process may be a bottleneck in the overall manufacturing process.

One promising solution to increase the throughput of ALD processing is processing a plurality of wafers (e.g., 20-250) simultaneously in a batch process. FIG. 3 schematically illustrates a conventional batch ALD reactor 10 having a processing enclosure 20 coupled to a gas supply 30 and a vacuum 40. The processing enclosure 20 generally includes an outer wall 22 and an annular liner 24. A platform 60 seals against the outer wall 22 or some other part of the processing enclosure 20 via a seal 62 to define a process chamber 25. Gas is introduced from the gas supply 30 to the process chamber 25 by a gas nozzle 32 that introduces gas into a main chamber 28 of the process chamber 25. Under influence of the vacuum 40, the gas introduced via the gas nozzle 32 will flow through the main chamber 28 and outwardly into an annular exhaust 26 to be drawn out with the vacuum 40. A plurality of workpieces W, e.g., semiconductor wafers, may be held in the processing enclosure 20 in a workpiece holder 70. In operation, a heater 50 heats the workpieces W to a desired temperature and the gas supply 30 delivers the first precursor A, the purge gas, and the second precursor B as discussed above in connection with FIG. 2.

However, when depositing material simultaneously on a large number of workpieces in an ALD reactor 10 such as that shown in FIG. 3, it can be difficult to uniformly deposit the precursors A and B across the surface of each of the workpieces W. Removing excess precursor from the spaces between the workpieces W can also be problematic. In an ALD reactor 10 such as that shown in FIG. 3, diffusion is the primary mechanism for removing residual precursor that is not chemisorbed on the surface of one of the workpieces. This is not only a relatively slow process that significantly reduces the throughput of the reactor 10, but it also may not adequately remove residual precursor. As such, conventional batch ALD reactors may have a low throughput and form nonuniform films.

In U.S. Patent Application Publication 2003/0024477 (the entirety of which is incorporated herein by reference), Okuda et al. suggest a system that employs a large plenum extending along the interior wall of a reaction tube. This plenum has a series of slots along its length with the intention of flowing gas parallel to the surfaces of the substrates treated in the tube. Although Okuda et al. suggest that this system may be used in both CVD and ALD applications, using such a system in ALD systems can be problematic. If a second precursor is introduced into the plenum before the first precursor is adequately purged from the plenum, the two precursors may react within the plenum. As a consequence, sufficient purge gas must be delivered to the plenum to adequately clear the first precursor, which may require even longer purge processes between delivery of the precursors. Such extended purges will reduce throughput and increase manufacturing costs. Throughput may be maintained by selecting less reactive precursors, but such precursors may require higher workpiece temperatures or preclude the use of some otherwise desirable precursors.

BRIEF DESCRIPTION OF THE DRAWINGS

FIGS. 1A and 1B are schematic cross-sectional views of stages in ALD processing in accordance with the prior art.

FIG. 2 is a graph illustrating a cycle for forming a layer using ALD techniques in accordance with the prior art.

DETAILED DESCRIPTION

A. Overview

Figure 3:
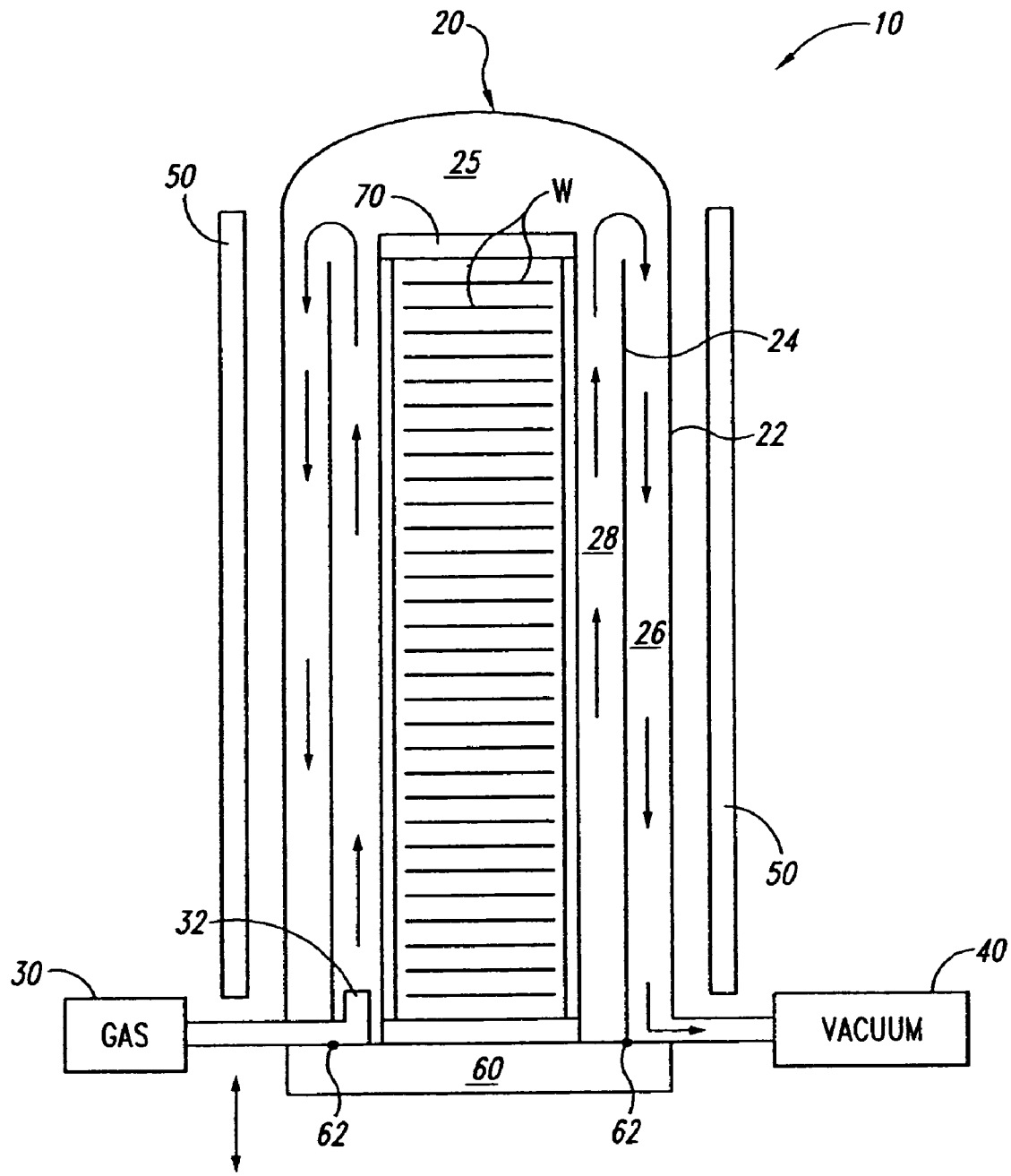
FIG. 3 is a schematic representation of a system including a reactor for depositing a material onto a microfeature workpiece in accordance with the prior art.

Various embodiments of the present invention provide microfeature workpiece processing systems and methods for depositing materials onto microfeature workpieces. Many specific details of the invention are described below with reference to exemplary systems for depositing materials onto microfeature workpieces. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates, insulative substrates, and many other types of materials. The microfeature workpieces typically have submicron features with dimensions of 0.05 microns or greater. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Moreover, the term "transverse" is used throughout to mean oblique, perpendicular, and/or not parallel. Several embodiments in accordance with the invention are set forth in FIGS. 4-9 and the following text to provide a thorough understanding of particular embodiments of the invention. A person skilled in the art will understand, however, that the invention may have additional embodiments, or that the invention may be practiced without several of the details of the embodiments shown in FIGS. 4-9.

Some embodiments of the invention provide microfeature workpiece processing systems. In one such embodiment, a microfeature workpiece processing system includes a process chamber, a first gas conduit, a second gas conduit, a first gas supply line, and a second gas supply line. The process chamber has a workpiece area adapted to receive a plurality of spaced-apart microfeature workpieces arranged relative to a longitudinal axis of the process chamber. The first gas conduit extends longitudinally within the process chamber proximate the workpiece area. This first gas conduit may have a plurality of first outlets spaced longitudinally along a length of the first gas conduit. The first outlets may be oriented toward the workpiece area and adapted to direct a first gas flow transverse to the longitudinal axis. In one embodiment, the second gas conduit may also extend longitudinally within the process chamber proximate the workpiece area and include a plurality of second outlets spaced longitudinally along a length of the second gas conduit. The second outlets may be oriented toward the workpiece area and adapted to direct the second gas flow transverse to the longitudinal axis. The direction of the second gas flow may be transverse to the direction of the first gas flow. The first gas supply line may be adapted to deliver a first gas to the first gas conduit, and the second gas supply line may be adapted to deliver a second gas to the second gas conduit. The second gas supply line may be independent of the first gas supply line, and the second gas may be different from the first gas.

A microfeature workpiece processing system in accordance with another embodiment of the invention includes a process chamber, a first gas conduit, a second gas conduit, a first gas supply line, and a second gas supply line. The process chamber may be adapted to receive a plurality of transversely oriented microfeature workpieces spaced from one another in a longitudinal direction. The first gas conduit may extend longitudinally within the process chamber and include a plurality of outlets spaced longitudinally along a length of the first gas conduit; each of the outlets is oriented to direct a first gas flow transversely across a surface of one of the workpieces. The second gas conduit may have a second outlet oriented to direct a second gas flow longitudinally within the process chamber, e.g., generally perpendicular to the direction of the first gas flow. The first gas supply line is adapted to deliver a first gas to the first gas conduit, and the second gas supply line is adapted to deliver a second gas to the second gas conduit.

An alternative embodiment of the invention provides a method of depositing a reaction product on each of a batch of microfeature workpieces. In accordance with this method, a plurality of workpieces may be positioned in the process chamber, with the workpieces spaced from one another in a first direction to define a process space between each pair of adjacent workpieces. A first gas may be delivered to an elongate first delivery conduit that has a length in the first direction and may direct a first gas flow of the first gas into at least one of the process faces from each of a plurality of outlets spaced in the first direction along the length of the first delivery conduit. Each of the first gas flows is directed to flow along a first vector transverse to the first direction. A second gas may be delivered to an elongate second delivery conduit that has a length in the first direction. A second gas flow of the second gas may be directed into at least one of the process spaces from each of a plurality of outlets spaced in the first direction along the length of the second delivery conduit. Each of the second gas flows may be directed to flow along a second vector that is transverse to the first direction and may also be transverse to the first vector.

An alternative embodiment of the invention provides a method of depositing a reaction product that includes positioning a plurality of microfeature workpieces similar to the previous method. A first gas may be delivered to a first delivery conduit and directed into process spaces between the workpieces as in the prior embodiment. In this embodiment, however, a second gas is delivered to a second delivery conduit and a second gas flow of the second gas is directed in the first direction, which may be substantially perpendicular to the first gas flow.

For ease of understanding, the following discussion is subdivided into two areas of emphasis. The first section discusses microfeature workpiece processing systems in accordance with selected embodiments of the invention. The second section outlines methods in accordance with other aspects of the invention.

B. Microfeature Workpiece Processing System

Figure 4:
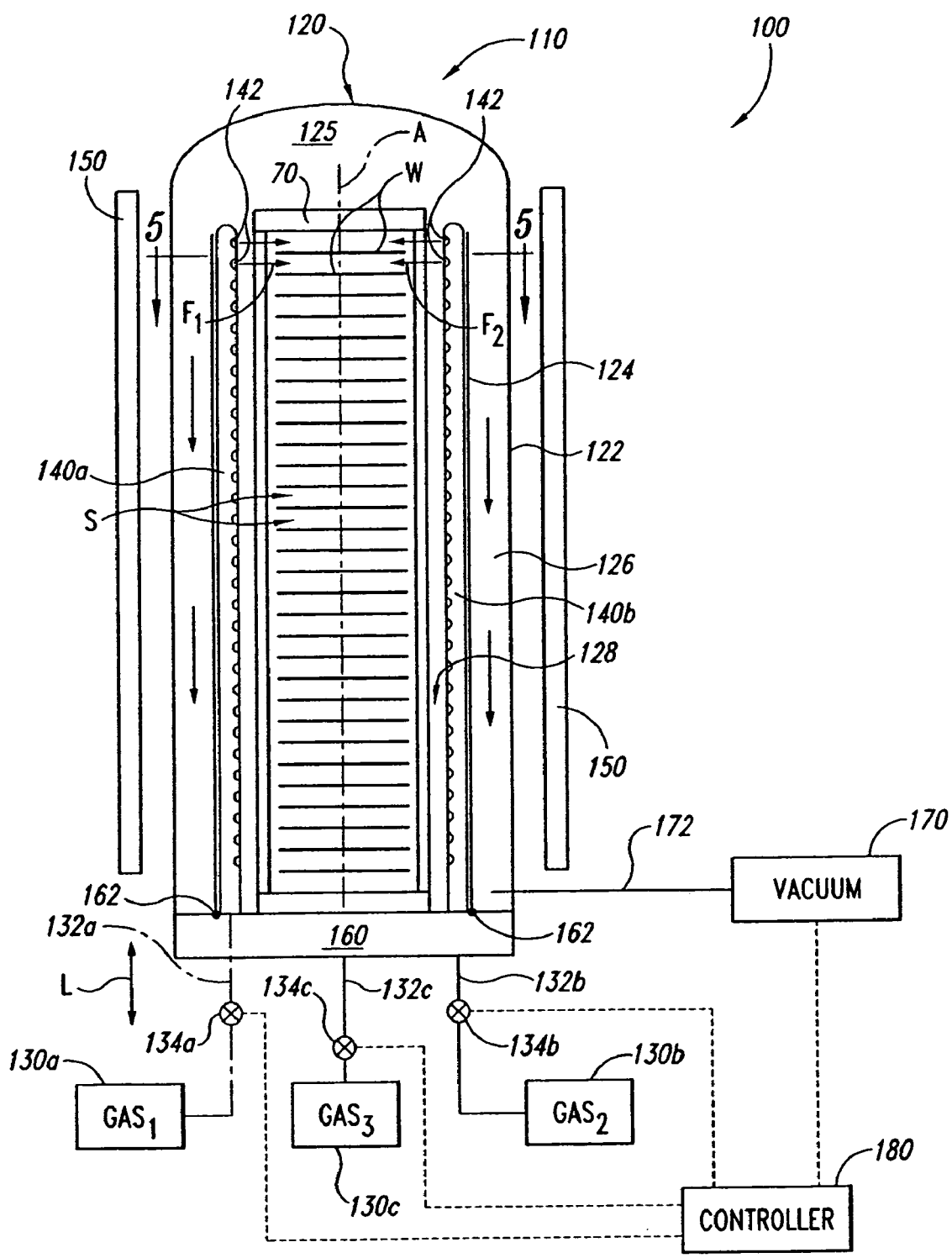
FIG. 4 is a schematic longitudinal cross-sectional view, taken along line 4-4 of FIG. 5, of a microfeature workpiece processing system in accordance with one embodiment of the invention.
Figure 5:
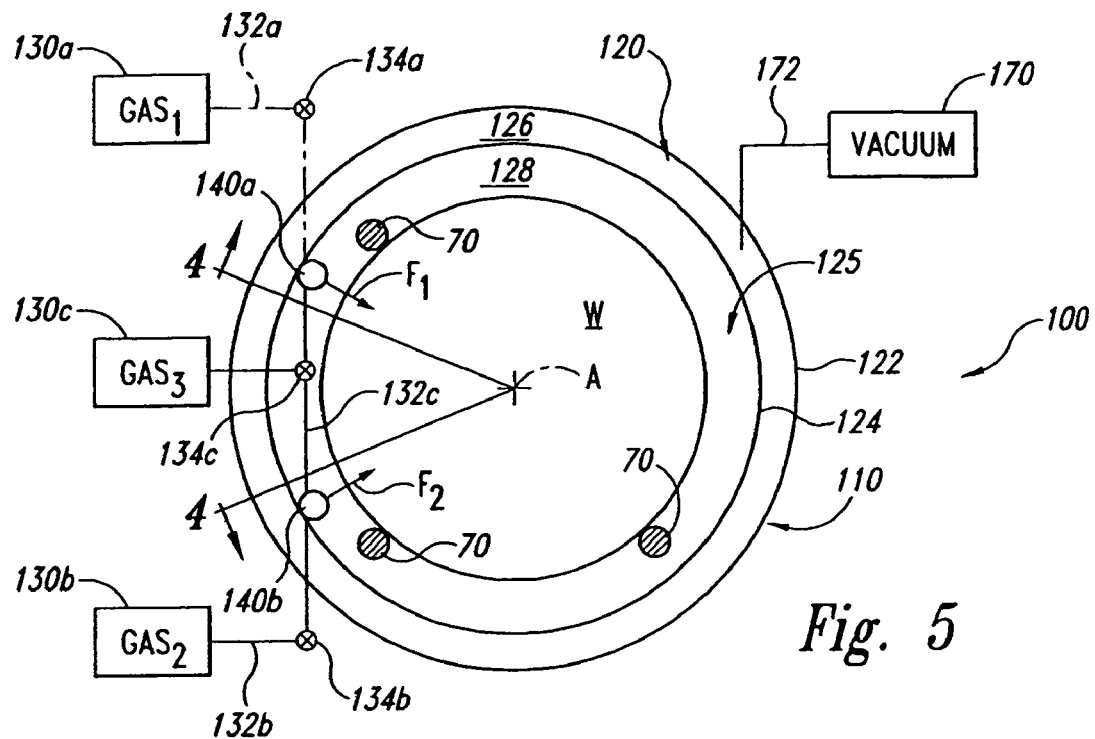
FIG. 5 is a schematic transverse cross-sectional view of the microfeature workpiece processing system of FIG. 4, taken along line 5-5 of FIG. 4.

FIGS. 4 and 5 schematically illustrate a microfeature workpiece processing system 100 in accordance with one embodiment of the invention. The processing system 100 includes a reactor 110 adapted to receive a plurality of microfeature workpieces W, which may be carried in a workpiece holder 70. The reactor 110 generally includes an enclosure 120 defined by an outer wall 122 and a platform 160 (FIG. 4) upon which the workpiece holder 70 may be supported. The outer wall 122 may sealingly engage the platform 160 (schematically illustrated in FIG. 4 as an O-ring seal 162). This will define a process chamber 125 within which the workpiece holder 70 and microfeature workpieces W may be received. In the embodiment shown in FIG. 4, the workpieces W are positioned in a workpiece area of the process chamber 125 that is substantially centered about a longitudinal axis A of the process chamber 125.

This particular reactor 110 includes an annular liner 124 that may functionally divide the process chamber 125 into a main chamber 128 and an annular exhaust 126. The annular exhaust 126 may be in fluid communication with a vacuum 170, e.g., a vacuum pump, via a vacuum line 172. During the pumping phase of the purge process noted above in connection with FIG. 2, the vacuum 170 may exhaust gas from the main chamber 128 via this annular exhaust 126.

The reactor 110 may also include a heater 150. The heater 150 can be any conventional design. In one exemplary embodiment, the heater 150 may comprise an induction heater. Other suitable heaters 150 for use in connection with particular processes to be carried out in the processing system 100 will be readily apparent to those skilled in the art.

The processing system 100 also includes a first gas conduit 140a and a second gas conduit 140b that extend longitudinally within the main chamber 128 of the process chamber 125. The gas conduits 140a-b are positioned proximate the workpiece area where the workpieces W are received. Each of the gas conduits 140 includes a plurality of outlets 142 spaced longitudinally along its length and oriented toward the workpieces W. In the illustrated embodiment, the outlets 142 of each of the gas conduits 140 are adapted to direct a flow of gas from one of the gas supplies 130a-c (discussed below) transverse to the longitudinal axis A of the process chamber 125. In one specific implementation, the outlets 142 may be oriented to direct a flow of gas perpendicular to this axis A. The first and second gas conduits 140a and 140b may be positioned within the main chamber 128 of the enclosure 120 in any suitable relative orientation. In the illustrated embodiment, the gas conduits 140a and 140b are substantially parallel to one another and oriented at an angle less than 180 degrees from one another. If so desired, the outlets 142 of the first gas conduit 140a may be oriented to direct a flow of gas generally parallel to the direction in which the outlets 142 of the second gas conduit 140b direct the flow of gas from the second gas conduit 140b. In the illustrated embodiment, the outlets 142 of the first gas conduit 140a may direct a first gas flow along a flow vector $F_1$ (FIG. 5) oriented generally toward the longitudinal axis A of the chamber 125, which may substantially coincide with the center of each workpiece W. The outlets 142 of the second gas conduit 140b may orient a second flow of gas along a second flow vector $F_2$ (FIG. 5) that is also oriented toward the longitudinal axis A. These two flow vectors $F_1$ and $F_2$ may be oriented transverse to one another. In CVD applications or in the purge processes of ALD, such transverse flow may facilitate high throughput without unduly compromising quality and uniformity.

The outlets 142 can also be positioned relative to the orientation of the workpieces W. The workpieces W are spaced apart in the workpiece holder 70 and oriented generally parallel to one another such that a process space S separates each pair of adjacent workpieces W. The outlets 142 can be configured to direct a flow of gas from respective gas conduit 140a or 140b transversely into each process space S. As a consequence, a flow of gas can be established transversely across a surface of each workpiece W. If the gas conduits 140a and 140b are used to deliver precursor gases in an ALD or CVD process, this transverse flow through the process spaces and across the surfaces of the workpieces W is expected to enhance the uniformity of material deposition on the surfaces of the workpieces W. If a purge gas is delivered through one or both of the gas conduits 140a and 140b, this transverse flow of gas along the flow vectors $F_1$ and/or $F_2$ can efficiently purge the process spaces S of any excess precursor gas.

The processing system 100 also includes at least two gas supplies. In particular, a first gas supply 130a of a first gas ($GAS_1$) is coupled to the first gas conduit 140a by a first gas supply line 132a. Similarly, a second gas supply 130b of a second gas ($GAS_2$) is coupled to the second gas conduit 140b by a second gas supply line 132b. If so desired, a first gas supply valve 134a may be provided in the first gas supply line 132a and a second gas supply valve 134b may be provided in the second gas supply line 132b. The processing system 100 may also include a third gas supply 130c adapted to provide a third gas ($GAS_3$), e.g., a purge gas, via a third gas supply line 132c. The third gas supply line 132c may be in fluid communication with the first gas supply line 132a and/or the second gas supply line 132b. This would permit delivery of the third gas ($GAS_3$) from the third gas supply line 130c to the process chamber 125 via one or both of the gas conduits 140a and 140b. A third gas supply valve 134c may be provided in the third gas supply line 132c.

The gas supply valves 134a-c may be operated to selectively introduce the desired process gas (e.g., $GAS_1$, $GAS_2$, $GAS_3$) under the direction of a controller 180. In one embodiment, the controller 180 comprises a computer having a programmable processor programmed to control operation of the processing system 100 to deposit material on the workpieces W. The controller 180 may be coupled to the vacuum 170 to control its operation. The controller 180 may also be operatively connected to the heater 150 to control the temperature of the workpieces W and/or an actuator (not shown) to move the platform 160 toward or away from the outer wall 122, as suggested by the arrow L, to allow the workpieces W to be loaded into or moved from the process chamber 125.

The composition of the gases in the gas supplies 130a-c can be varied depending on the process to be carried out in the processing system 100. If the processing system 100 is used in an ALD process, for example, the first gas supply 130a may contain a first precursor (e.g., precursor A discussed above in FIGS. 1 and 2) and the second gas supply 130b may contain a second precursor (e.g., precursor B in FIGS. 1 and 2). The reaction tube suggested by Okuda et al. in U.S. Patent Application Publication US 2003/0024477 delivers all the gases to a relatively large common plenum. As discussed above, this plenum arrangement can have a number of disadvantages, including longer purge times, decreased throughput, and increased manufacturing costs. In contrast, the microfeature workpiece processing system 100 of FIGS. 4 and 5 may deliver the reaction precursors through separate gas conduits 140. Using separate gas conduits 140 permits a transverse flow of gas through the process spaces S to enhance product uniformity and throughput, but avoids the problems expected to be encountered in a system that employs a single common plenum such as that suggested by Okuda et al.

Figure 6:
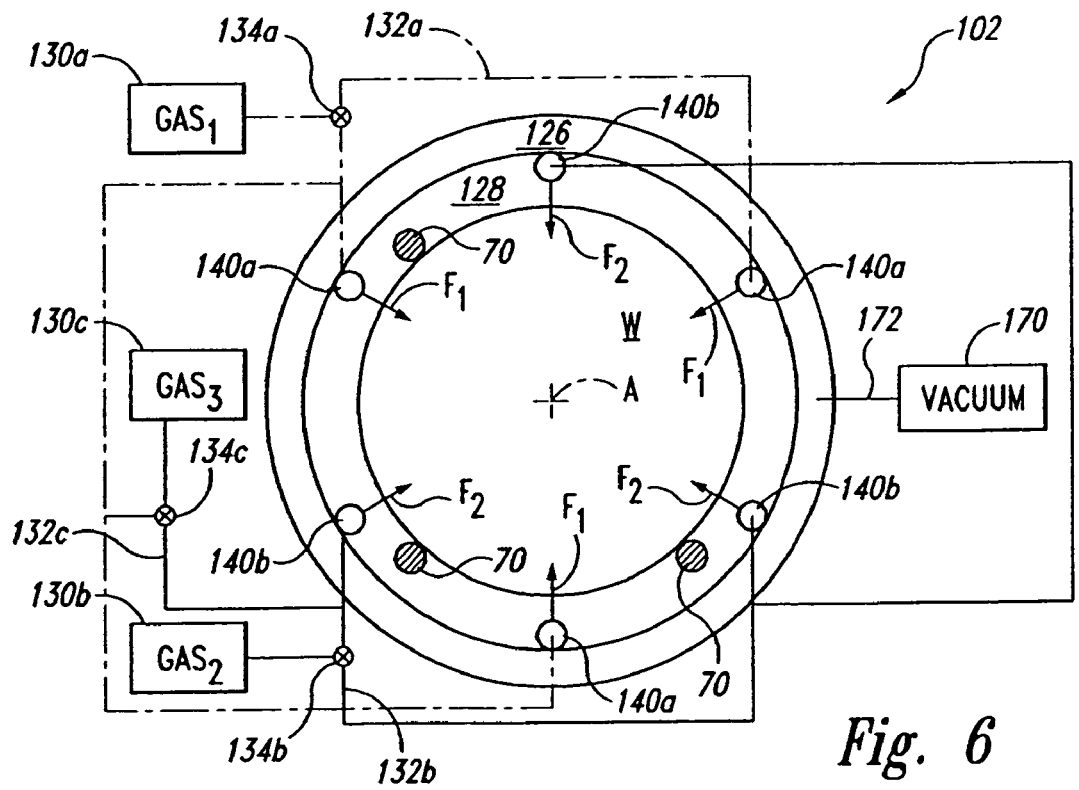
FIG. 6 is a schematic transverse cross-sectional view of a microfeature workpiece processing system in accordance with a modified embodiment of the invention.

FIG. 6 schematically illustrates a microfeature workpiece processing system 102 in accordance with another embodiment of the invention. This processing system 102 may be similar in many respects to the processing system 100 of FIGS. 4 and 5 and like reference numbers are used to indicate like elements in FIGS. 4-6. The processing system 100 of FIGS. 4 and 5 includes a single first gas conduit 140a and a single second gas conduit 140b, each of which is adapted to deliver a separate gas, i.e., $GAS_1$, or $GAS_2$, respectively. The processing system 102 of FIG. 6, however, includes several first gas conduits 140a and several second gas conduits 140b. In the specific implementation shown in this figure, three first gas conduits 140a are spaced approximately equiangularly about the periphery of the workpiece area where the workpieces W are received. Each of the first gas conduits 140a is adapted to direct a flow of gas along a flow vector $F_1$ that is oriented toward and perpendicular to the longitudinal axis A of the process chamber (125 in FIG. 4). As a consequence, each of the first gas flow vectors $F_1$ are transverse to one another, as well. The three second gas conduits 104b of FIG. 6 also may be spaced approximately equiangularly about the periphery of the workpiece area. Each of the second gas conduits 140b is adapted to direct a second flow of gas along a second gas flow vector $F_2$ that is oriented toward and perpendicular to the longitudinal axis A of the process chamber 125 and transverse to one another. It is anticipated that the use of multiple flow vectors for each gas supply can further enhance uniformity of gas distribution across the surfaces of the workpieces W.

Figure 7:
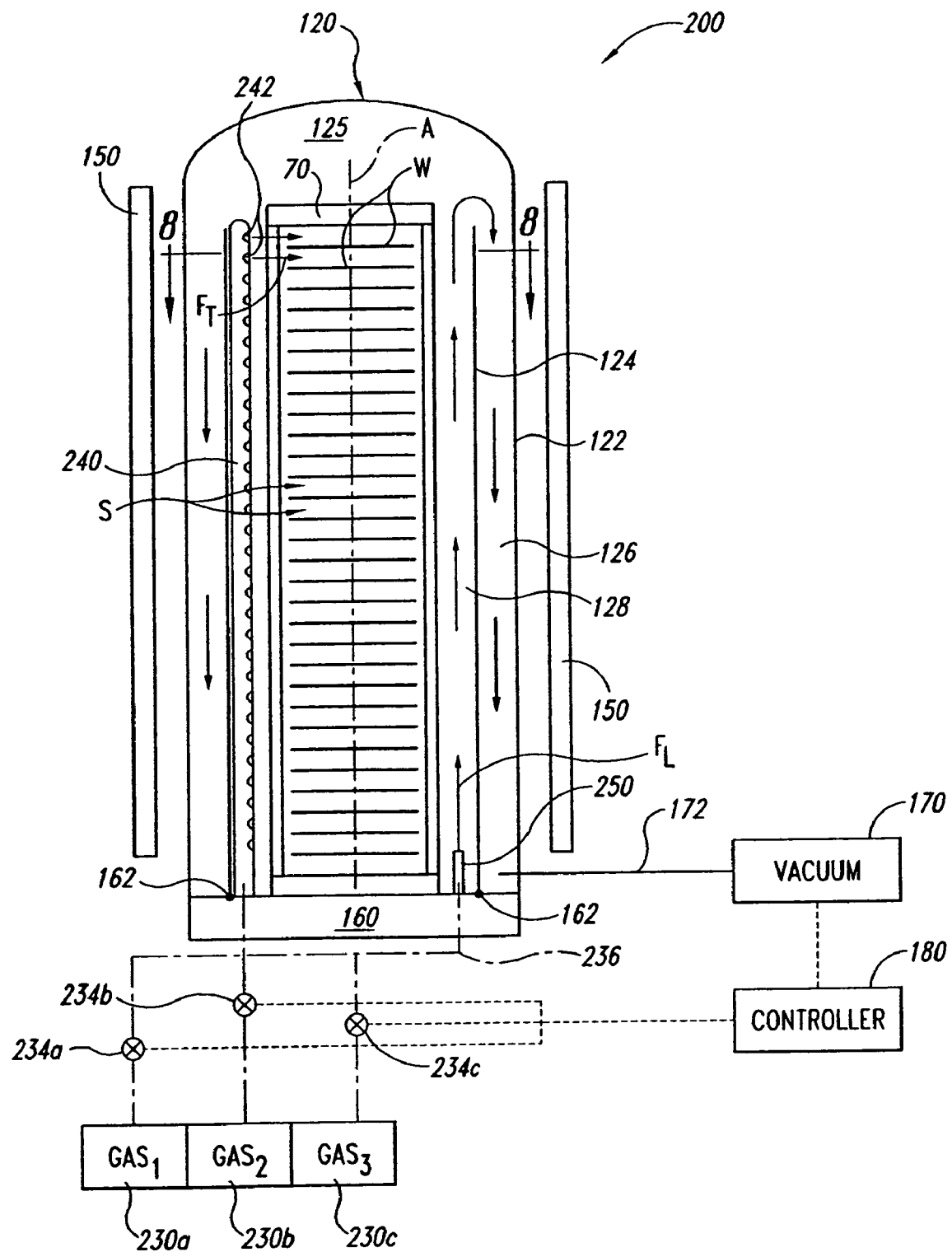
FIG. 7 is a schematic longitudinal cross-sectional view, taken along line 7-7 of FIG. 8, of a microfeature workpiece processing system in accordance with another embodiment of the invention.
Figure 8:
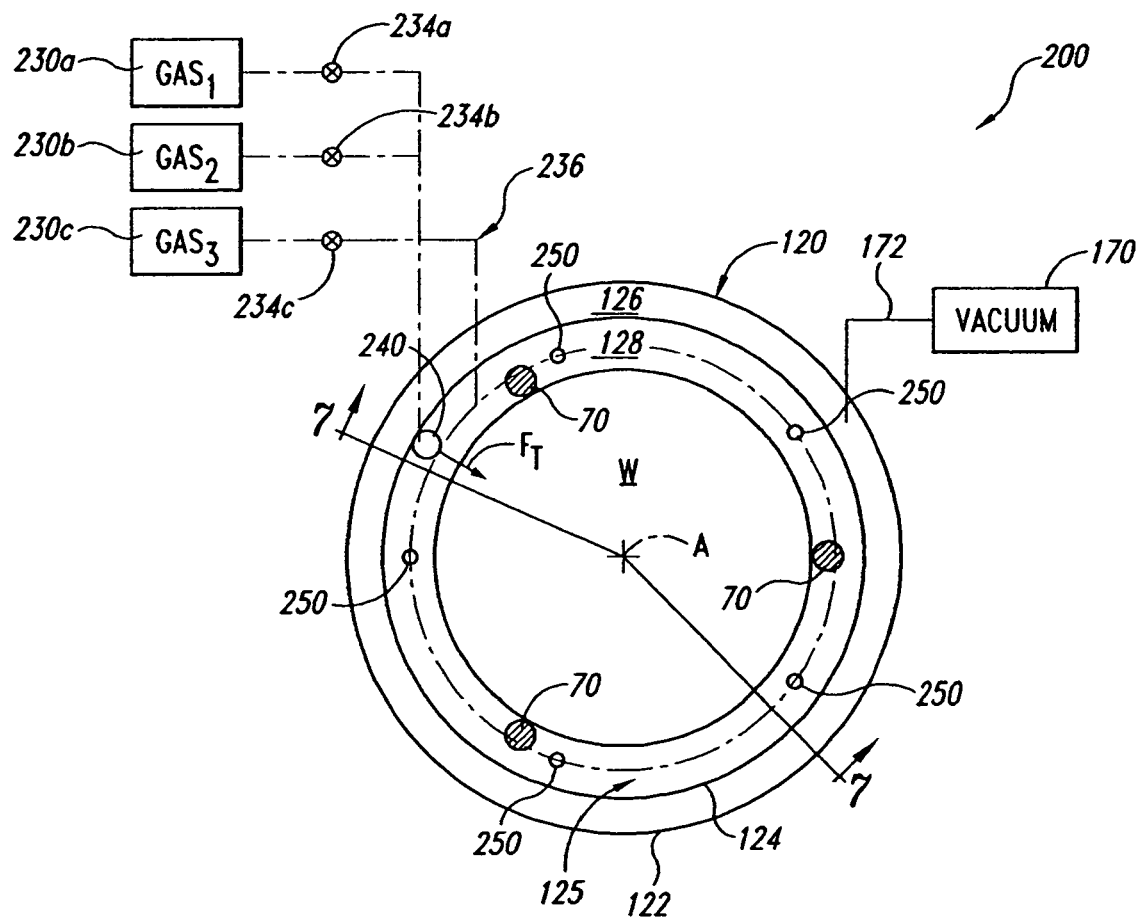
FIG. 8 is a schematic transverse cross-sectional view of the microfeature workpiece processing system of FIG. 7, taken along the line 8-8 in FIG. 7.

FIGS. 7 and 8 illustrate a microfeature workpiece processing system 200 in accordance with another embodiment of the invention. Many of the elements of the processing system 200 may be substantially the same as elements of the processing system 100 of FIGS. 4 and 5 and like reference numbers are used in both pairs of drawings to indicate like elements.

The microfeature workpiece processing system 200 of FIGS. 7 and 8 includes a single longitudinally extending gas conduit 240 deposed within the main chamber 128 of the enclosure 120. A number of outlets 242 may be spaced longitudinally along a length of the gas conduit 240, with at least one outlet 242 associated with each process space S defined by the workpieces W. The construction and orientation of the gas conduit 240 may be substantially the same as that of the first or second gas conduit 140a or 140b of FIGS. 4 and 5. As a consequence, the outlets 242 of the gas conduit 240 are adapted to direct a flow of gas along a transverse flow vector $F_T$, which may be oriented generally toward the center of an associated process space S and generally perpendicular to the longitudinal axis A of the process chamber 125.

The specific microfeature workpiece processing system 200 shown in FIGS. 7 and 8 includes the single gas conduit 240. It should be understood, though, that any number of gas conduits 240 may be employed. By analogy to the plurality of first gas conduits 140a in FIG. 6, for example, a series of gas conduits 240 having a common gas supply (discussed below) may be spaced about the periphery of the workpiece area.

In addition to the gas conduit 240, the processing system 200 of FIGS. 7 and 8 includes one or more longitudinal conduits or nozzles 250 adapted to direct a flow of gas along a longitudinally oriented flow vector $F_L$. This flow vector $F_L$ may be substantially parallel to the longitudinal axis A of the process chamber 125 and generally perpendicular to the transverse flow vectors $F_T$ from the outlets 242 of the gas conduit 240. In one embodiment, a single longitudinal nozzle 250 is positioned in the main chamber 128 of the enclosure 120. As best seen in FIG. 8, though, the illustrated embodiment utilizes a number of longitudinal nozzles 250 arranged peripherally about the workpiece area in which the workpieces W are received. The particular implementation shown in FIG. 8 positions five longitudinal nozzles 250 substantially equiangularly about this periphery, but any suitable number of longitudinal nozzles 250 may be employed.

The microfeature workpiece processing system 200 of FIGS. 7 and 8 includes a plurality of gas supplies 230a, 230b, and 230c coupled to a common gas supply manifold 236. A separate gas supply valve 234a, 234b, or 234c may be associated with each of the gas supplies 230a, 230b, and 230c, respectively. These gas supply valves 234 may be operatively coupled to the controller 180 to control the flow of gas through the common gas supply manifold 236. The common gas supply manifold 236 may deliver a gas from one or more of the gas supplies 230a-c to the longitudinally extending gas conduit(s) 240 and the longitudinal nozzle(s) 250. When the controller 180 opens one or more of the gas supply valves 234a-c, a gas can be delivered through the common gas supply manifold 236 simultaneously to the gas conduit 240 and each of the longitudinal nozzles 250. This can enhance the bulk flow rate of the desired gas into the main chamber 128 of the enclosure 120 while establishing sufficient transverse flow of the gas through the process spaces S to achieve the necessary uniformity of gas distribution across the surfaces of the workpieces W or an appropriately swift purging of the process spaces S.

Figure 9:
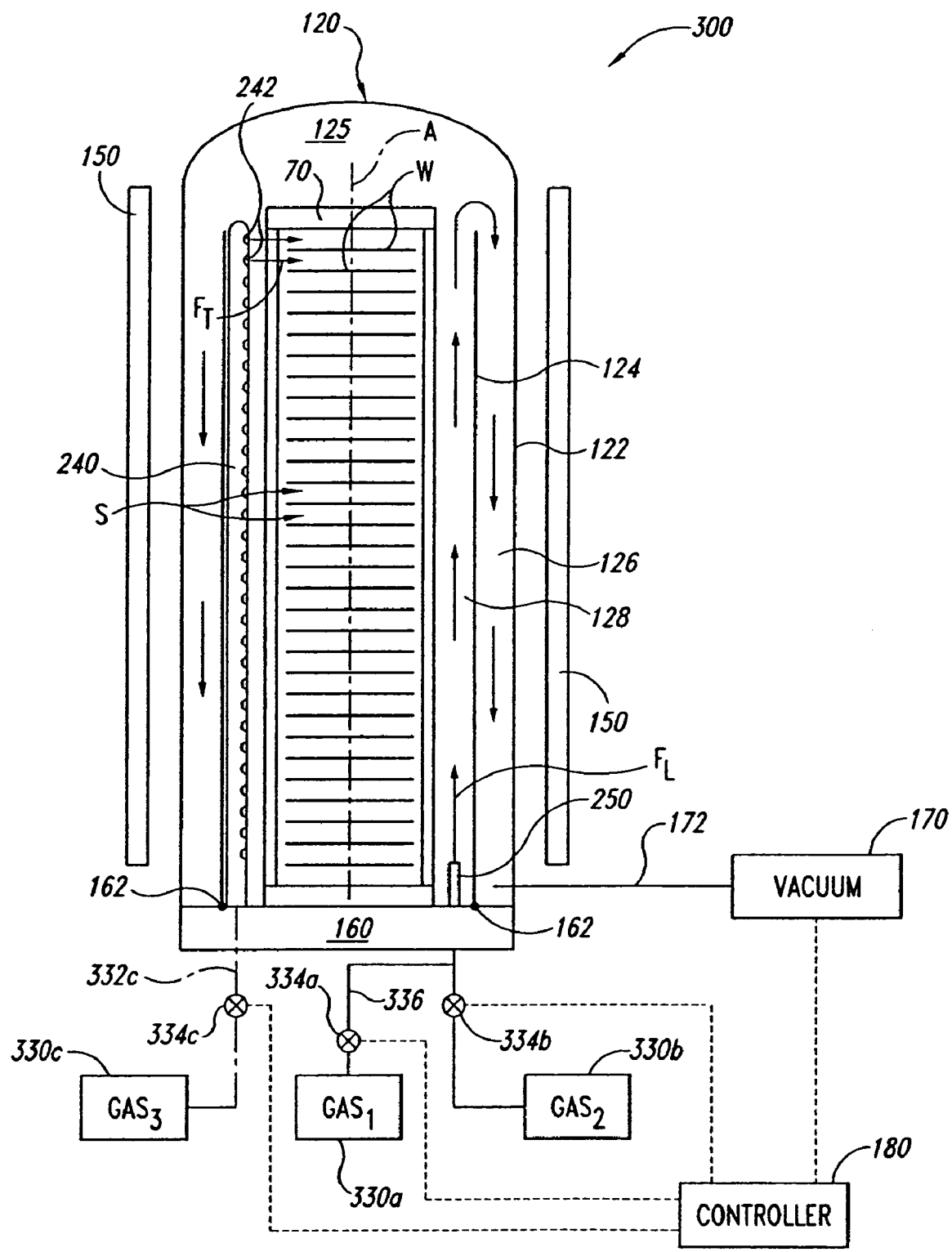
FIG. 9 is a schematic longitudinal cross-sectional view of a microfeature workpiece processing system in accordance with still another embodiment of the invention.

FIG. 9 schematically illustrates a microfeature workpiece processing system 300 in accordance with yet another embodiment of the invention. Many of the elements of this processing system 300 may be substantially the same as the elements of the processing system 200 shown in FIG. 7; like reference numbers are used in FIGS. 7 and 9 to indicate like elements.

One difference between the processing systems 200 and 300 of FIGS. 7 and 9 relates to the gas supply. In the embodiment shown in FIG. 7, the gas conduit 240 and the longitudinal nozzles 250 share a common gas supply manifold 236. In the embodiment shown in FIG. 9, the longitudinal nozzle(s) 250 is in fluid communication with a gas supply manifold 336. This gas supply manifold 336 is coupled to a first gas supply 330a by a first gas supply valve 334a and a second gas supply 330b by a second gas supply valve 334b. The gas supply valves 334a and 334b are operatively connected to the controller 180 to control the composition and flow rate of gas delivered to the longitudinal nozzle(s) 250.

The longitudinally extending gas conduit 240 is connected to an independent gas supply 330c via a third gas supply line 332c. A third gas supply valve 334c may be operatively connected to the controller 180 to control the flow of the third gas ($GAS_3$) delivered to the gas conduit 240.

The composition of the gasses ($GAS_1$, $GAS_2$, and $GAS_3$) can be varied to achieve different process objectives. In one embodiment, the first gas supply 330a contains a first precursor A, the second gas supply 330b contains a second precursor B, and the third gas supply 330c includes a purge gas. This enables the precursors A and B to be delivered to the main chamber 128 of the enclosure 120 in a relatively conventional fashion. Delivering the purge gas ($GAS_3$) transversely through the outlets 242 can fairly rapidly purge any excess precursor in the process spaces S between the workpieces W. In contrast with the conventional ALD reactor 10 shown in FIG. 3, which relies primarily on diffusion to purge excess precursor from the process spaces S, the transverse flow of purge gas through the process spaces S can significantly reduce the time needed to conduct the purge cycle without adversely affecting quality of the deposited material.

C. Methods of Depositing Materials on Microfeature Workpieces

As noted above, other embodiments of the invention provide methods of processing microfeature workpieces. In the following discussion, reference is made to the particular microfeature workpiece processing system 100 shown in FIGS. 4 and 5. It should be understood, though, that reference to this particular processing system is solely for purposes of illustration and that the methods outlined below are not limited to any particular processing system shown in the drawings or discussed in detail above. In addition, the following discussion focuses primarily on ALD. It should be recognized, however, that the processes outlined below are not limited to ALD and may have utility in CVD applications and in connection with processes other than material deposition.

One embodiment of the invention provides a method of depositing a reaction product on each of a batch of microfeature workpieces. A plurality of microfeature workpieces W may be positioned in a workplace area of the process chamber 125. In one embodiment, the workpieces W are held by a workpiece holder 70 in a spaced-apart relationship. In the embodiments illustrated above, the workpiece holder 70 orients the workpieces W generally perpendicular to the longitudinal axis A of the process chamber 125, defining a series of transversely oriented process spaces S between the workpieces W.

A first gas may be delivered to the process chamber 125. Using the processing system 100 of FIG. 4 as an example, the first gas ($GAS_1$) may be delivered from the first gas supply 130a to the first gas conduit 140a by the first gas supply line 132a. This may be accomplished by the controller 180 sending a signal to open the first gas supply valve 134a. The first gas ($GAS_1$) is delivered transversely into the processing spaces S along a series of generally parallel first transverse flow vectors $F_1$. This first gas ($GAS_1$) may comprise a first precursor for the ALD reaction. Once a sufficient quantity of this precursor is delivered to the process spaces S to chemisorb a layer of the precursor on the surface of the workpiece W, the first gas supply valve 134a may be closed by the controller 180. Thereafter, a purge gas ($GAS_3$) can be delivered through the first gas conduit 140a and/or the second gas conduit 140b. This transverse flow of purge gas through the process spaces S will fairly rapidly remove any excess precursor from the process spaces S. Either during the delivery of the purge gas or after the flow of the purge gas is terminated by closing the third gas supply valve 134c, the vacuum 170 may be actuated to exhaust gas from the process chamber 125 via the annular exhaust 126. The vacuum 170 can continue to operate after the third gas supply valve 134c is closed by the controller 180 until a desired reduced pressure is achieved.

The controller 180 may open the second gas supply valve 134b to deliver a second precursor gas ($GAS_2$) from the second gas supply 130b via the second gas conduit 140b. The outlets 142 of the second gas conduit 140b will deliver a transverse flow of this second precursor to the process spaces S, facilitating reaction with the previously chemisorbed first precursor to yield the desired reaction product. After a sufficient quantity of the second precursor gas ($GAS_2$) is delivered to the process chamber 125, the process chamber 125 may again be purged by delivering the purge gas ($GAS_3$) and pumping down the process chamber 125 using the vacuum 170. This process can be repeated as many times as necessary to achieve a layer of material on the surfaces of the workpieces W having the desired thickness.

Unless the context clearly requires otherwise, throughout the description and the claims, the words "comprise," "comprising," and the like are to be construed in an inclusive sense as opposed to an exclusive or exhaustive sense, that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

The above-detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above-detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. A microfeature workpiece processing system comprising:
 a process chamber having a workpiece area adapted to receive a plurality of spaced-apart microfeature workpieces arranged relative to a longitudinal axis of the process chamber;
 a first set of injection tubes having three first gas conduits extending longitudinally within the process chamber proximate the workpiece area, each of the first gas conduits having a plurality of first outlets spaced longitudinally along a length of each of the first gas conduits, the first outlets being oriented toward the workpiece area and adapted to direct a first gas flow transverse to the longitudinal axis, wherein the three first gas conduits are equiangularly spaced apart along a periphery of the process chamber and at an angle less than 180 degrees from one another;

a second set of injection tubes having three second gas conduits extending longitudinally within the process chamber proximate the workpiece area, each of the second gas conduits having a plurality of second outlets spaced longitudinally along a length of each of the second gas conduits, the second outlets being oriented toward the workpiece area and adapted to direct a second gas flow transverse to the longitudinal axis, wherein the second gas conduits are equiangularly spaced apart along a periphery of the process chamber and at an angle less than 180 degrees from one another, and wherein each adjacent pair of the first gas conduits is separated by one of the second gas conduits and each adjacent pair of the second gas conduits is separated by one of the first gas conduits;

a first gas supply line adapted to deliver a first gas to the first gas conduit;

a second gas supply line adapted to deliver a second gas to the second gas conduit, the second gas supply line being independent of the first gas supply line and the second gas being different from the first gas; and a controller operatively coupled to the first gas supply line and the second gas supply line, the controller being programmed to terminate the first gas flow before initiating the second gas flow.

2. The microfeature workpiece processing system of claim 1 wherein the first and second outlets are oriented to direct the first gas flow transverse to the second gas flow.

3. The microfeature workpiece processing system of claim 1 wherein the first outlets are oriented to direct the first gas flow substantially perpendicular to the longitudinal axis of the process chamber.

4. The microfeature workpiece processing system of claim 3 wherein the second outlets are oriented to direct the second gas flow substantially perpendicular to the longitudinal axis of the process chamber.

5. The microfeature workpiece processing system of claim 1 wherein the first outlets are oriented to direct the first gas flow toward centers of the microfeature workpieces.

6. The microfeature workpiece processing system of claim 5 wherein the second outlets are oriented to direct the second gas flow toward centers of the microfeature workpieces.

7. The microfeature workpiece processing system of claim 1 wherein the first gas conduits are substantially parallel to the second gas conduits.

8. The microfeature workpiece processing system of claim 1 further comprising a third gas supply line adapted to deliver a third gas to the process chamber.

9. The microfeature workpiece processing system of claim 1 further comprising a vacuum adapted to exhaust the first gas from the process chamber before the second gas flow is initiated.

10. The microfeature workpiece processing system of claim 1 wherein each pair of the plurality of spaced-apart microfeature workpieces is separated by a process space, and wherein individual first and second outlets generally correspond to each process space to deliver a flow of the first and second gas to each process space, respectively.

11. A microfeature workpiece processing system comprising:
a process chamber adapted to receive a plurality of microfeature workpieces spaced from one another in a first direction to define process spaces between adjacent workpieces;
a first gas supply line;
a second gas supply line;
a first set of injection tubes having three first gas conduits in fluid communication with the first gas supply line and having an outlet length extending in the first direction within the process chamber, each of the first gas conduits having a plurality of first outlets spaced along the outlet length in the first direction, the first outlets being adapted to direct a first gas flow from the first gas supply line transversely into the process spaces, wherein the three first gas conduits are equiangularly spaced apart along a periphery of the process chamber and at an angle less than 180 degrees from one another;
a second set of injection tubes having three second gas conduits in fluid communication with the second gas supply line and having an outlet length extending in the first direction within the process chamber, each of the second gas conduits having a plurality of second outlets spaced along the outlet length in the first direction, the second outlets being adapted to direct a second gas flow from the second gas supply line transversely into the process spaces, wherein the second gas conduits are equiangularly spaced apart along a periphery of the process chamber and at an angle less than 180 degrees from one another, and wherein each adjacent pair of the first gas conduits is separated by one of the second gas conduits and each adjacent pair of the second gas conduits is separated by one of the first gas conduits;
a controller operatively coupled to the first gas supply line and to the second gas supply line and adapted to selectively control the first gas flow and the second gas flow; and
a purge gas supply line adapted to deliver a purge gas to the process chamber;
wherein the controller is programmed to terminate the first gas flow and deliver the purge gas to the process chamber to purge excess first gas from the process chamber before initiating the second gas flow.

12. The microfeature workpiece processing system of claim 11 wherein the first and second outlets are oriented to direct the first gas flow transverse to the second gas flow.

13. The microfeature workpiece processing system of claim 11 wherein the first outlets are oriented to direct the first gas flow toward centers of the microfeature workpieces.

14. The microfeature workpiece processing system of claim 13 wherein the second outlets are oriented to direct the second gas flow toward centers of the microfeature workpieces.

15. The microfeature workpiece processing system of claim 11 wherein the first gas conduits are substantially parallel to the second gas conduits.

16. The microfeature workpiece processing system of claim 11 further comprising a third gas supply line adapted to deliver a third gas to the process chamber.

17. The microfeature workpiece processing system of claim 11 further comprising a vacuum coupled to the controller and adapted to exhaust the first gas from the process chamber before the second gas flow is initiated.

* * * * *